United States Patent
Fuse

(10) Patent No.: US 7,141,510 B2
(45) Date of Patent: Nov. 28, 2006

(54) PLASMA PROCESSING METHOD

(75) Inventor: Takashi Fuse, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 110 days.

(21) Appl. No.: 10/811,931

(22) Filed: Mar. 30, 2004

(65) Prior Publication Data

US 2004/0191932 A1   Sep. 30, 2004

(30) Foreign Application Priority Data

Mar. 31, 2003   (JP)   ............................. 2003-096666

(51) Int. Cl.
*H01L 21/302* (2006.01)
(52) U.S. Cl. ...................... 438/723; 438/706; 438/712; 216/58
(58) Field of Classification Search ................ 438/706, 438/710, 712, 714, 723; 216/58, 69; 430/312, 430/313
See application file for complete search history.

(56) References Cited

U.S. PATENT DOCUMENTS 6,326,307 B1* 12/2001 Lindley et al. ............. 438/689
6,653,734 B1* 11/2003 Flanner et al. .............. 257/758

\* cited by examiner

*Primary Examiner*—Nadine Norton
*Assistant Examiner*—Binh X. Tran
(74) *Attorney, Agent, or Firm*—Oblon, Spivak, McClelland, Maier & Neustadt, P.C.

(57) ABSTRACT

A plasma processing method is conducted while a thickness of a resist film being monitored, thereby preventing the thickness of the resist film from being reduced. The plasma processing method includes steps of supplying a processing gas into an airtight processing chamber, and plasma-processing a target layer formed on an object to be processed by using a resist film as a mask. The method includes a main etching process (first process) of plasma-processing the target layer while the thickness of the resist film being monitored until the reduction rate of the thickness of the resist film reaches a predetermined value, and an overetching process (second process) of plasma-processing the target layer in a changed process condition in which selectivity against the resist film is higher than in the first process.

4 Claims, 4 Drawing Sheets

PLASMA PROCESSING METHOD

FIELD OF THE INVENTION

The present invention relates to a plasma processing method; and, more particularly, to an etching method applied to a semiconductor device manufacturing process.

BACKGROUND OF THE INVENTION

Generally, a silicon-based semiconductor layer, such as a silicon oxide film and a polycrystalline silicon layer, needs to be etched while fabricating MOS structures, such as memories or logics, on a substrate to be processed, e.g., a semiconductor wafer (hereinafter, referred to as "wafer"). For instance, a layer structure, in which a resist film is formed as a mask on a silicon oxide film on a base silicon film, is etched to form a fine contact hole through the silicon oxide film. (See, e.g., Japanese Patent Laid-open Publication Nos. 2000-91317 and H9-27471 and U.S. Pat. No. 6,081,334).

In a conventional plasma processing method, CF-based gas, such as $CF_4$ and $C_2F_6$, fed as a processing gas into a processing chamber of a plasma processing apparatus is converted into plasma to be used to etch a silicon oxide film formed on an object to be processed in the processing chamber by the plasma. In this case, in order to increase an etching rate, a main etching process is performed until a base silicon film underlying the silicon oxide film is about to be exposed, and the remaining portion of the silicon oxide film is subjected to an over-etching process. In the main etching process, because the base silicon film is not exposed, the etching is conducted at a high etching rate, and in the over-etching process, the etching is performed under a process condition wherein the selectivity against the base silicon film is high so as to prevent the base silicon film from being eroded.

As described above, there has been disclosed the technique wherein the main etching process is shifted to the over-etching process on the basis of the exposure of the base layer. For example, in Japanese Patent Laid-open Publication No. H9-27471, the main etching process is conducted for a predetermined time period that is estimated in advance by measuring the etching time needed to reach the stage wherein the base layer is about to be exposed, and then the over-etching process is carried out.

Further, in U.S. Pat. No. 6,081,334, the main etching process is conducted until the base layer is about to be exposed and then the over etching process begins to be performed, wherein the transition time is determined by monitoring the thickness of a polysilicon layer to be processed by irradiating light to a wafer and then detecting the light reflected from the wafer.

However, in case of etching the silicon oxide film by using the resist film as the mask as described above, the thickness of the resist film is rapidly reduced after the base silicon film starts being exposed. The reason for this is considered as follows.

When the silicon oxide film is plasma-etched by using the CF-based processing gas, a reaction product, such as CFx, is generated to be attached to a surface of the resist film, wherein since the reaction product acts as a protective layer of the resist film, plasma resistance of the resist film is increased. But, after the base silicon film starts being exposed, the generation of the reaction product is reduced.

Furthermore, the effect of a reaction product suppressing gas, such as $O_2$, contained in the processing gas is increased in removing the reaction product attached to the resist film. Consequently, the resist film itself is etched.

Accordingly, in a process wherein the base layer is exposed such as the over-etching process, the thickness of the resist film is rapidly reduced such that there occurs an area where the resist film is eliminated in the course of the etching process, thereby undesirably etching a portion which should not be etched.

Therefore, since it is highly desirable to prevent the thickness of the resist film from being reduced during the etching process, it is preferable that the etching process be conducted while paying more attention to the thickness of the resist film instead of the base layer. That is, preferably, the main etching process is shifted to the over-etching process based on the thickness of the resist film, and the over-etching process is then conducted under a process condition that the thickness of the resist film is not reduced.

However, although there has been disclosed a method of shifting the main etching process to the over-etching process on the basis of the base layer, there has not been suggested a method of shifting the main etching process to the over-etching process while the thickness of the resist film being monitored.

SUMMARY OF THE INVENTION

It is, therefore, an object of the present invention to provide a plasma processing method capable of preventing a thickness of a resist film from being reduced by plasma-processing a target layer with reference to the resist film. In accordance with an aspect of the present invention, there is provided a plasma processing method including the steps of: supplying a processing gas into an airtight processing chamber, plasmizing the processing gas, and plasma-processing a target layer formed on an object to be processed by using a resist film as a mask, wherein the plasma-processing is conducted under a process condition that is changed on the basis of a variation of a thickness reduction rate of the resist film.

The above plasma-processing step may include a first process wherein the target layer is plasma-processed while the thickness of the resist film is monitored until the thickness reduction rate of the resist film reaches a predetermined value; and a second process in which the target layer is plasma-processed under a changed process condition in which selectivity against the resist film is higher than in the first process.

In the present invention, the etching is conducted while the thickness of the resist film being monitored, thereby preventing the thickness of the resist film from being reduced.

Further, the target layer may include an oxide layer containing silicon. In this case, the first process is conducted by using a processing gas containing a CF-based gas, and the second process is conducted by using a processing gas containing a CHF-based gas. The second process is conducted under the process condition wherein the processing gas contains the CHF-based gas so that the reduction in the thickness of the resist film can be prevented.

The second process may be conducted under a process condition by using a processing gas containing components reduced in the chamber during the first process. When the thickness of the resist film is rapidly reduced, the second process is conducted under a process condition that the reduced components are compensated, thereby preventing the thickness of the resist film from being reduced in the second process.

The target layer may include an oxide layer containing silicon. In this case, the first process is conducted by using a processing gas containing a CF-based gas, and the second process is conducted by using a processing gas containing a COx gas. In case that the CF-based gas (CxFy gas) is used as the processing gas and the silicon oxide film is plasma-etched by using the resist film as the mask, the amount of COx, such as CO and $CO_2$, is reduced to thereby decrease selectivity against the resist film. Accordingly, the second process is conducted while COx, such as CO and $CO_2$, as the processing gas compensates for reduced CO, thereby increasing the selectivity against the resist film to prevent the thickness of the resist film from being reduced.

The thickness of the resist film may be monitored by detecting interference waves of rays reflected from the resist film in the first process. Thereby, the thickness of the resist film is directly evaluated, and an end point of the first process, depending on the thickness of the resist film, is reliably determined. Accordingly, the thickness of the resist film is prevented from being reduced.

Throughout this specification, 1 mTorr is $(10^{-3} \times 101325/760)$ Pa, and 1 sccm is $(10^{-6}/60) m^3/sec$.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE PREFERRED EMBODIMENTS

Figure 1:
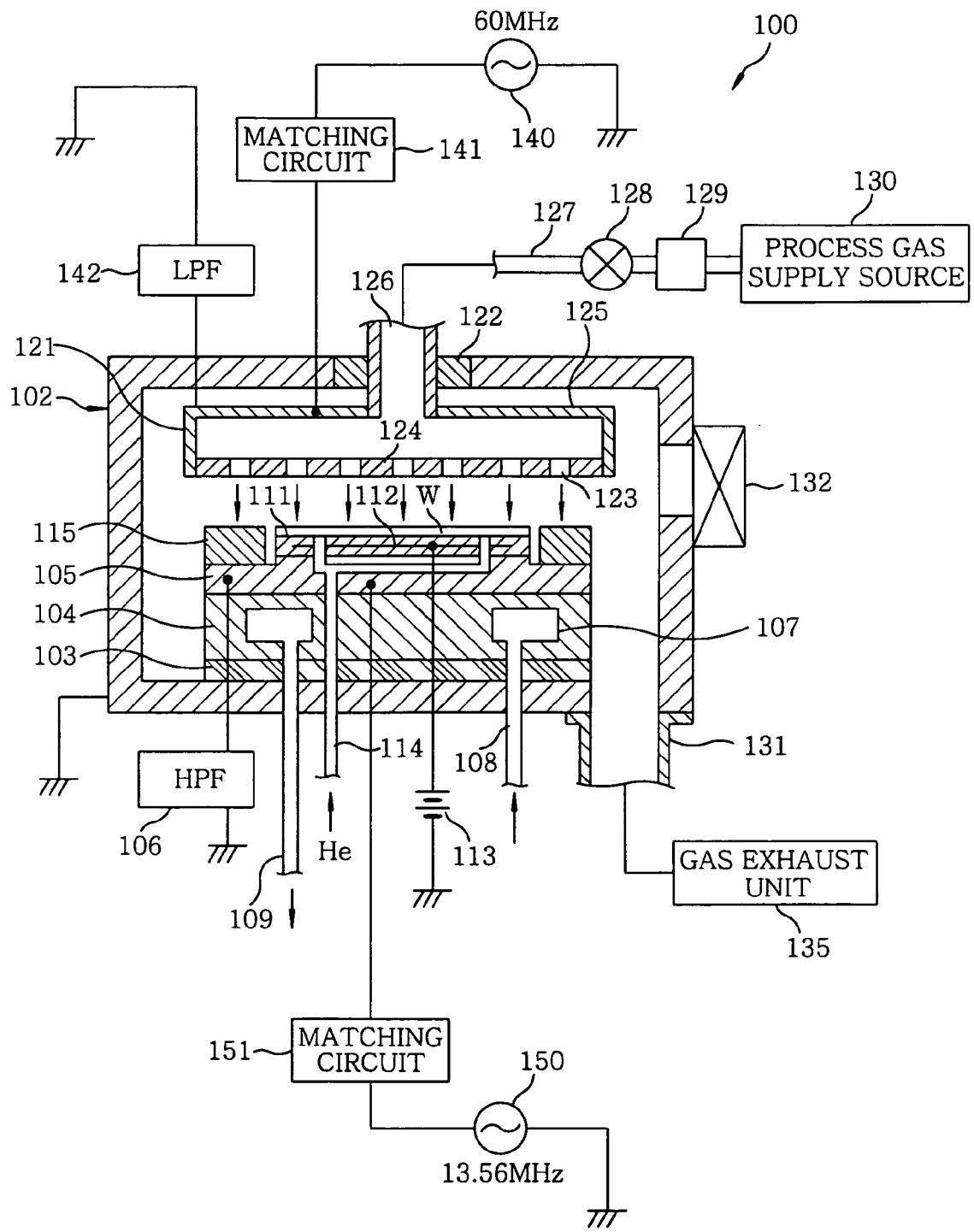
FIG. 1 depicts a schematic sectional view of a plasma processing apparatus for practicing a plasma processing method in accordance with a first preferred embodiment of the present invention.

Hereinafter, a plasma processing apparatus in accordance with a preferred embodiment of the present invention will be described in detail with reference to the accompanying drawings. Further, in this specification and the accompanying drawings, like reference numerals will be given to like parts having substantially same functions, and redundant description thereof will be omitted.

(First Embodiment)

A plasma processing apparatus, e.g., an etching apparatus, in accordance with the first embodiment of the present invention will now be described in detail with reference to the drawings. Referring to FIG. 1, there is illustrated a schematic sectional view of the etching apparatus. The etching apparatus 100 is structured such that an upper and a lower electrode plate are positioned to face each other in parallel and are connected to respective plasma generating power supplies. The etching apparatus 100 is so-called a capacitively coupled parallel plate type etching apparatus.

The etching apparatus 100 includes a cylindrical processing chamber 102 made of aluminum whose surface is anodized (alumited), the processing chamber 102 being grounded. A substantially columnar susceptor supporting table 104 is installed on a bottom of the processing chamber 102 via an insulating plate 103 made of, e.g., ceramic. Further, a susceptor 105 (hereinafter, also referred to as "lower electrode") acting as a lower electrode is provided on the susceptor supporting table 104. The susceptor 105 is connected to a high pass filter (HPF) 106.

A temperature control medium channel 107 is provided in the susceptor supporting table 104. A temperature control medium is fed through an inlet line 108 into the temperature control medium channel 107. The temperature control medium circulates along the temperature control medium channel 107, and is then exhausted through an outlet line 109. The circulation of the temperature control medium allows a temperature of the susceptor 105 to be controlled at a desired level.

Further, the susceptor 105 is provided at its upper central portion with a disk-shaped protrusion, and an electrostatic chuck 111 having almost the same shape as the wafer W is provided thereon. The electrostatic chuck 111 is structured such that an electrode 112 is embedded in an insulating material. When a DC voltage of, e.g., about 1.5 kV is applied to the electrode 112 from a DC power supply 113 connected to the electrode 112, the wafer W is electrostatically attached to the electrostatic chuck 111 by an electrostatic force.

A gas channel 114 for supplying a heat transfer medium (for example, backside gas such as He gas) to a backside of the wafer W is formed through the insulating plate 103, the susceptor supporting table 104, the susceptor 105, and the electrostatic chuck 111, so that the heat is transferred between the susceptor 105 and the wafer W via the heat transfer medium, thereby having the wafer W to be maintained at a predetermined temperature.

An annular focus ring 115 is arranged on an upper peripheral portion of the susceptor 105 in such a way that the focus ring 115 surrounds the wafer W placed on the electrostatic chuck 111. The focus ring 115 is formed of an insulating material such as ceramic or quartz, or a conductive material, and functions to enhance an etching uniformity.

An upper electrode 121 is installed above the susceptor 105 in such a way that they are positioned to face each other in parallel. The upper electrode 121 is supported within the processing chamber 102 through an insulating member 122. The upper electrode 121 is comprised of an electrode plate 124 facing the susceptor 105 and having a plurality of injection openings 123 formed therethrough, and an electrode supporting member 125 supporting the electrode plate 124. The electrode plate 124 is formed of, e.g., silicon or silicon carbide, and the electrode supporting member 125 is formed of a conductive material, e.g., aluminum whose surface is alumited. Furthermore, the distance between the susceptor 105 and the upper electrode 121 is adjustable.

A gas inlet 126 is provided at the center of an upper part of the electrode supporting member 125 of the upper electrode 121, and is connected to a gas supply line 127 which is in turn connected through a valve 128 and a mass flow controller 129 to a process gas supply source 130.

An etching gas, to be used in a plasma-etching process, is supplied from the process gas supply source 130. Even though one process gas supply system including the process gas supply source 130 is shown in FIG. 1, a plurality of process gas supply systems may be installed in the etching apparatus to independently control respective flow rates of gases such as $C_4F_6$, $CF_4$, Ar and $O_2$ and supply the gases into the processing chamber 102.

Meanwhile, an exhaust line 131 is connected between a bottom of the processing chamber 102 and a gas exhaust unit 135. The gas exhaust unit 135 is provided with a vacuum pump, such as a turbo molecular pump, and evacuates the processing chamber 102 to a predetermined reduced pressure (for example, 0.67 Pa or lower). Additionally, a gate valve 132 is installed at a sidewall of the processing chamber 102.

Further, a first high frequency power supply 140 is electrically connected via a first matching circuit 141 to the upper electrode 121. Furthermore, a low pass filter (LPF) 142 is connected to the upper electrode 121. The first high frequency power supply 140 has a frequency ranging from 50 to 150 MHz. By applying a high frequency power in such a range, a plasma of high density in a desired dissociation state can be generated within the chamber 102, which makes it possible to execute a plasma etching under a pressure lower than that in conventional cases. The frequency of the first high frequency power supply 140 preferably ranges from 50 to 80 MHz. Typically, its frequency is 60 MHz as shown in FIG. 1 or thereabouts.

Figure 2:
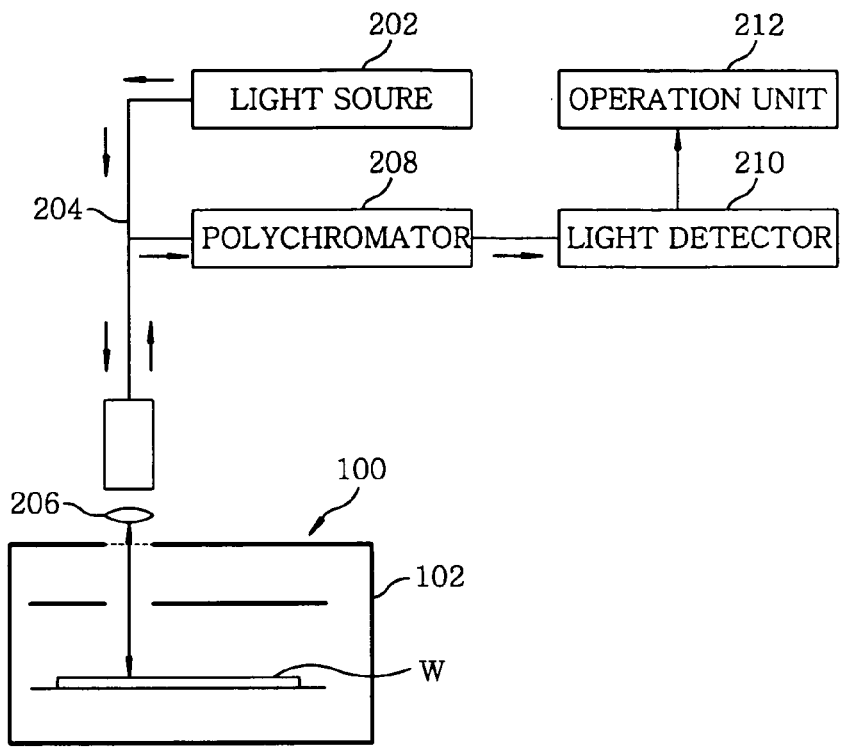
FIG. 2 schematically illustrates a unit for monitoring a thickness of a resist film in the first preferred embodiment.

A second high frequency power supply 150 is connected via a second matching circuit 151 to the susceptor 105 acting as the lower electrode. Additionally, the second high frequency power supply 150 has the frequency ranging from several hundred KHz to less than twenty MHz. By applying a power of a frequency in such a range, a proper ionic action can be facilitated without causing any damage on the wafer W to be processed. Typically, the frequency of the second high frequency power supply 150 is, e.g., 13.56 MHz as shown in FIG. 2 or 2 MHz.

(Film Thickness Monitoring Unit)

Meanwhile, the etching apparatus 100 includes a thickness monitoring unit to detect a thickness of a layer, such as a resist film, formed on the wafer W. For example, the thickness monitoring unit observes the thickness of the resist film by detecting interference waves of rays reflected from the resist film. Referring to FIG. 2, there is schematically illustrated the thickness monitoring unit of the above case. In the thickness monitoring unit, light is irradiated from a light source 202 through an optical fiber 204, a lens 206, and an irradiation window (not shown) to a surface of the wafer W located in the processing chamber 102 of the etching apparatus 100. The light reflected by the wafer W is detected by using a polychromator 208 and a light detector 210, and an output sign from the light detector 210 is processed by an operating unit 212.

In the case of detecting the thickness of the resist film formed on a silicon oxide film to be processed, light reflected from a surface of the resist film interferes with another light reflected from an interface between the resist film and the silicon oxide film. The intensity of interference light depends on the thickness of the resist film. Accordingly, the thickness of the resist film is observed by detecting the intensity of the interference light, thereby making it possible to control a process condition depending on the thickness of the resist film.

A halogen lamp or an LED lamp may be used as the light source 202. In the case of using the halogen lamp, a wavelength range thereof is relatively wide (for example, a xenon lamp has a wavelength ranging from about 250 nm to 800 nm or above). As for the LED lamp, the wavelength range is very narrow (for example, from 450 to 470 nm) so that the interference light is detected by observing only a single wavelength of, e.g., 460 nm. Therefore, when the LED lamp is used as the light source 202, an etching ending time can be stably detected. Furthermore, the LED lamp is favorable to be used as the light source 202 since the LED lamp has a longer life and consumes less power than the halogen lamp.

(Operation of Plasma Processing Apparatus)

Hereinafter, a detailed description will be given of the operation of the etching apparatus 100. To etch a wafer W, after the gate valve 132 is opened, the wafer W is transferred into the processing chamber 102 and is disposed on the electrostatic chuck 111. The gate valve 132 is then closed and the processing chamber 102 is evacuated by the gas exhaust unit 135. Subsequently, the valve 128 is opened and a processing gas from the process gas supply source 130 is supplied into the processing chamber 102 to a predetermined pressure. Under the circumstance, the predetermined high frequency powers are applied from the respective first and second high frequency power supplies 140, 150 to the processing chamber 102 so that the processing gas is plasmized to act on the wafer W.

Meanwhile, a DC power from the DC power supply 113 is applied to the electrode 112 in the electrostatic chuck 111 to electrostatically attach the wafer W to a surface of the electrostatic chuck 111. Additionally, a coolant at a predetermined temperature is supplied into the temperature control medium channel 107 to cool the susceptor 105. At the same time, the heat transfer medium (for example, a backside gas such as a He gas) is supplied to the backside of the wafer W under a predetermined pressure to control a surface temperature of the wafer W at a desired level.

(Layer Structure to be Plasma-processed)

Figure 4A:
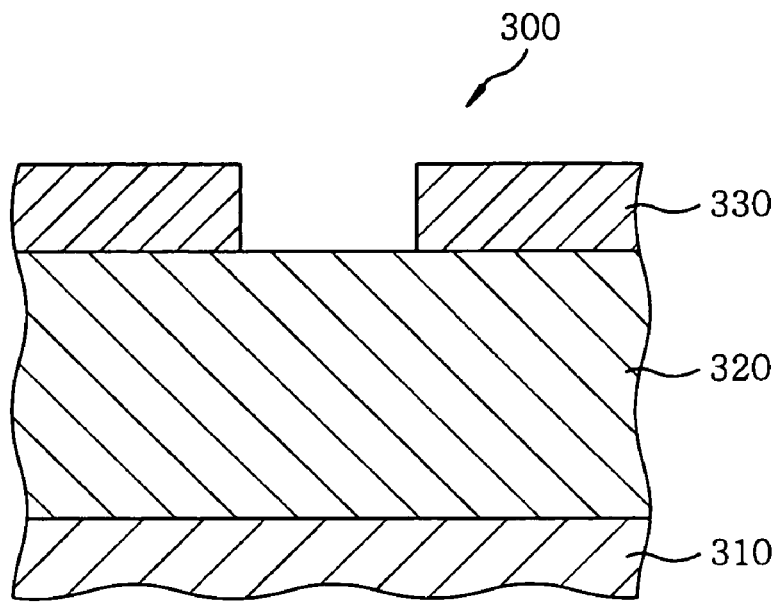
FIGS. 4A to 4C are sectional views schematically illustrating an etching process of a layer structure in accordance with the first embodiment of the present invention.

Hereinafter, the etching of a target layer to be processed by the etching apparatus 100 will be described with reference to the drawings. Here, an oxide film formed on the wafer W is etched by using a resist, containing oxygen, as a mask. In particular, a layer structure 300 as shown in FIG. 4A is etched. The layer structure 300 includes a base silicon film 310, a target silicon oxide film 320 ($SiO_2$ film) formed on the base silicon film 310, and a resist film 330 formed on the silicon oxide film 320. As the resist film 330, for example, an ArF photo resist film is used. Prior to the etching of the silicon oxide film 320, the resist film 330 on the silicon oxide film 320 was patterned in a predetermined pattern with, e.g., openings by an exposing and a developing process. In addition, the resist film 330 may be formed on the silicon oxide film 320 with an organic-based reflection prevention layer interposed therebetween.

Meanwhile, the target layer is not limited to the silicon oxide film, but may be exemplified by an oxide layer (oxygen compound layer) such as TEOS, BPSG, PSG, SOG, thermal oxide layer, HTO, FSG, organic-based silicon oxide film, and CORAL (manufactured by Novellus Systems, Inc.), an organic low-k dielectric layer, a metal layer, and a metal compound layer. Further, the resist film is not limited to the ArF photo resist film, but may be exemplified by a KrF photo resist film or a $F_2$ photo resist film.

(Principle of the Present Invention)

The principle of the present invention will now be described. First, there will be described on the variation in thickness of the resist film 330 obtained while the silicon oxide film 320 as shown in FIG. 4A is etched to form a contact hole, with reference to the drawings.

The etching of the silicon oxide film 320 is conducted under a first process condition as follows. An interior pressure of the processing chamber 102 is 20 mT, a high frequency power applied to both of the upper and lower electrodes 121, 105 is 1800 W, and $C_4F_6$, $CF_4$, Ar, and $O_2$ as the processing gas are fed into the processing chamber 102 at respective flow rates of $C_4F_6/CF_4/Ar/O_2$=35 sccm/14 sccm/700 sccm/36 sccm. Respective temperatures at the upper electrode 121, at the lower electrode 105 and on a sidewall of the processing chamber 102 are set to 20° C., 50°

C. and 60° C., a distance between the upper electrode 121 and the wafer W is set to 25 mm, and pressures of the backside gas supplied to the center and edges of the backside of the wafer W are set to 5 Torr and 25 Torr, respectively. Further, a diameter of the wafer W is 200 mm, the thickness of the resist film is 440 nm, and the thickness of the silicon oxide film 320 is 2.0 μm.

A main etching process is conducted under the first process condition until the base silicon film 310 is about to be exposed, and an over-etching process is then conducted under the same process condition. During the main and the over-etching process, the light is irradiated to a surface of the wafer W, and interference waves of rays reflected from the surface of the wafer is detected by using the light detector 210 to monitor the thickness of the resist film. There is illustrated in FIG. 3 a graph showing the thickness of the resist film 330 as a function of time.

For example, in case that the main etching process had been conducted for 150 seconds until the base silicon film 310 was about to be exposed, an etching rate of the resist film 330 was 86 nm/min, and the thickness of the resist film 330 was 197 nm. After the exposure of the base silicon film 310, when the over-etching process had been conducted for 30 seconds, the etching rate of the resist film 330 was 200 nm/min, and the thickness of the resist film 330 was 121 nm.

Figure 3:
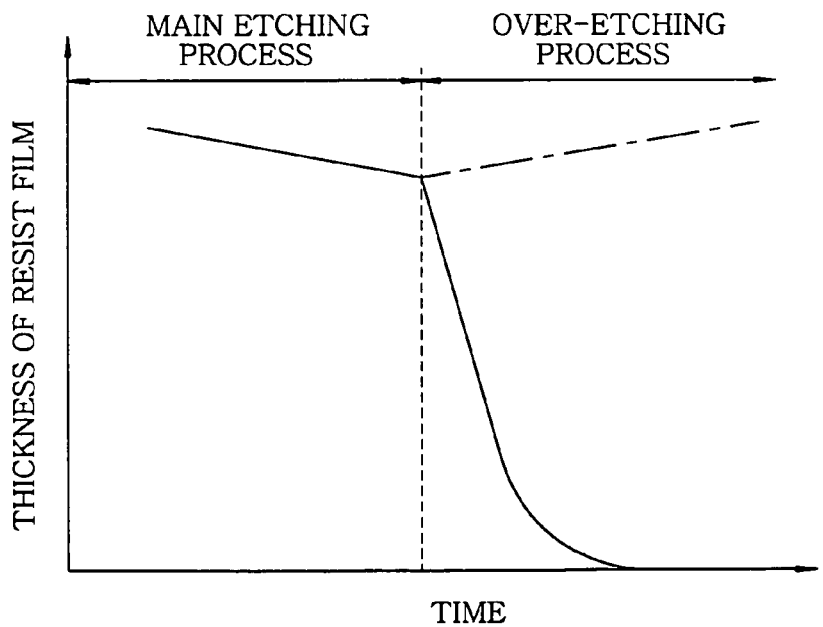
FIG. 3 is a graph showing the thickness of the resist film as a function of time.

From FIG. 3, it can be seen that the thickness of the resist film 330 was rapidly reduced after the base silicon film 310 was exposed. The reason for this is as follows.

Under the first process condition, the processing gas contains a CF-based gas such as $C_4F_6$ and $CF_4$. Hence, when the processing gas is plasmized to etch the wafer W, a reaction product such as CFx is generated and then attached to a surface of the resist film 330. At this time, the reaction product acts as a protective layer of the resist film 330, and a selectivity against the resist film 330 is increased.

After the base silicon film 310 begins to be exposed by the etching of the silicon oxide film 320, however, the generation of the reaction product is reduced so that the protective layer attached to the resist film 330 is decreased. Furthermore, since the effect of a reaction product suppressing gas, such as $O_2$, contained in the processing gas is increased in removing the reaction product attached to the resist film 330, thereby causing the resist film 330 itself to be etched.

In case that, by using CxFy, Ar, and $O_2$ as the processing gas, the layer structure 300 as shown in FIG. 4A is etched, i.e., the silicon oxide film 320 is etched by using the resist film 330 as the mask, CxFy functions to erode the silicon oxide film 320. Additionally, $O_2$ serves to remove the reaction product. The reason for adding $O_2$ to the processing gas is to prevent the amount of the reaction product attached to the resist film 330 from getting too large. If the amount of the reaction product is too much, holes of the patterned resist film 330 would be clogged to thereby hinder the etching.

When the silicon oxide film ($SiO_2$) 320 is plasma-processed by using the above processing gas, CxFy chemically reacts with $SiO_2$, leading to the abrasion of $SiO_2$. Due to such chemical reaction, CO and SiFx gases are generated and at the same time CFx is produced as a reaction product. The reaction product, CFx, is attached to the surface of the resist film 330 and acts as the protective layer therefor. At this time, because the processing gas contains $O_2$, the amount of the reaction product CFx attached to the resist film 330 is suppressed.

Meanwhile, it is known that COx serves to suppress the effect of $O_2$ in removing the reaction product. Accordingly, while a large portion of the silicon oxide film ($SiO_2$) 320 still remains without being etched as in the main etching process, CxFy reacts with $SiO_2$ to generate plenty of CFx as the reaction product and at the same time, a large amount of CO is generated to thereby suppress the effect of $O_2$ in removing the reaction product. As a result, a relatively large amount of CFx as the reaction product is attached to the resist film 330.

However, when the etching process on the silicon oxide film 320 progresses such that the resist film 330 begins to be thinning rapidly, the base layer begins to be exposed, and the silicon oxide film ($SiO_2$) 320 must have been almost removed. Hence, the chemical reaction of CxFy with $SiO_2$ is reduced. Therefore, the amount of CFx as the reaction product is reduced and the amount of CO is simultaneously reduced. In case the amount of CFx is reduced, the amount of the reaction product, acting as the protective layer of the resist film 330, attached to the resist film 330 is reduced. Additionally, as described above, in case the amount of CO is reduced, it is difficult to suppress the effect of $O_2$ in removing the reaction product, and therefore, the removal of the reaction product will progress actively. As a result, the reaction product is not attached to the resist film 330 any more, and at the same time the reaction product already attached thereto begins to be removed. Further, $O_2$ contained in the processing gas also acts to etch the resist film 330 to reduce the resist selectivity, thereby reducing the thickness of the resist film 330 exposed to $O_2$ which is no longer protected by the protective layer.

As described above, based on the fact that the resist film 330 begins to be rapidly thinned after a specific time elapsed, in the present invention, the main etching processing is changed to the over-etching process depending on the thickness of the resist film 330, and the over-etching process is conducted under a process condition that the thickness of the resist film 330 is not reduced. Specifically, during the main etching process (first process), the thickness of the resist film 330 is being kept monitored and the main etching process is shifted to the over-etching process (second process) at the time when a reduction rate of the thickness of the resist film 330 is suddenly increased, as indicated by the dotted line shown in FIG. 3. Further, the over-etching process is conducted under a process condition in which the thickness of the resist film 330 is not reduced. In this way, the thickness of the resist film 330 can be prevented from being reduced during the etching of the layer structure.

(Example of Plasma Processing)

Figure 4B:
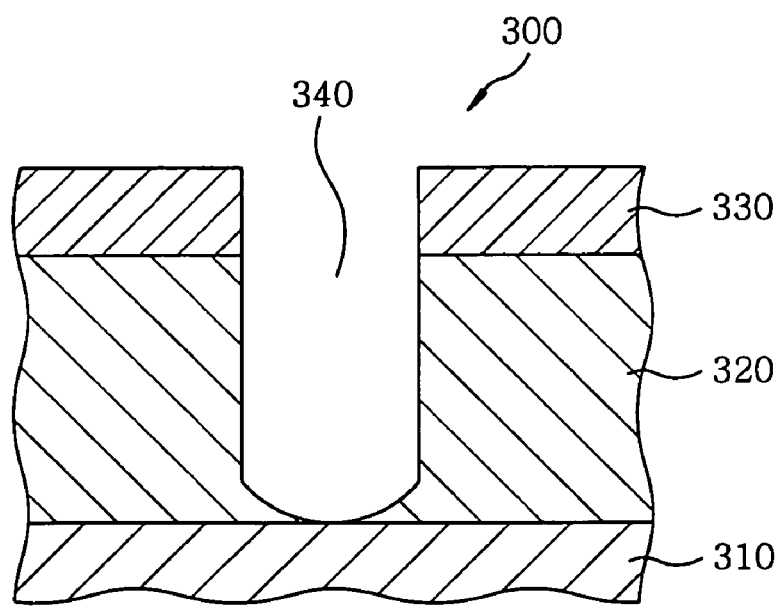
Figure 4C:
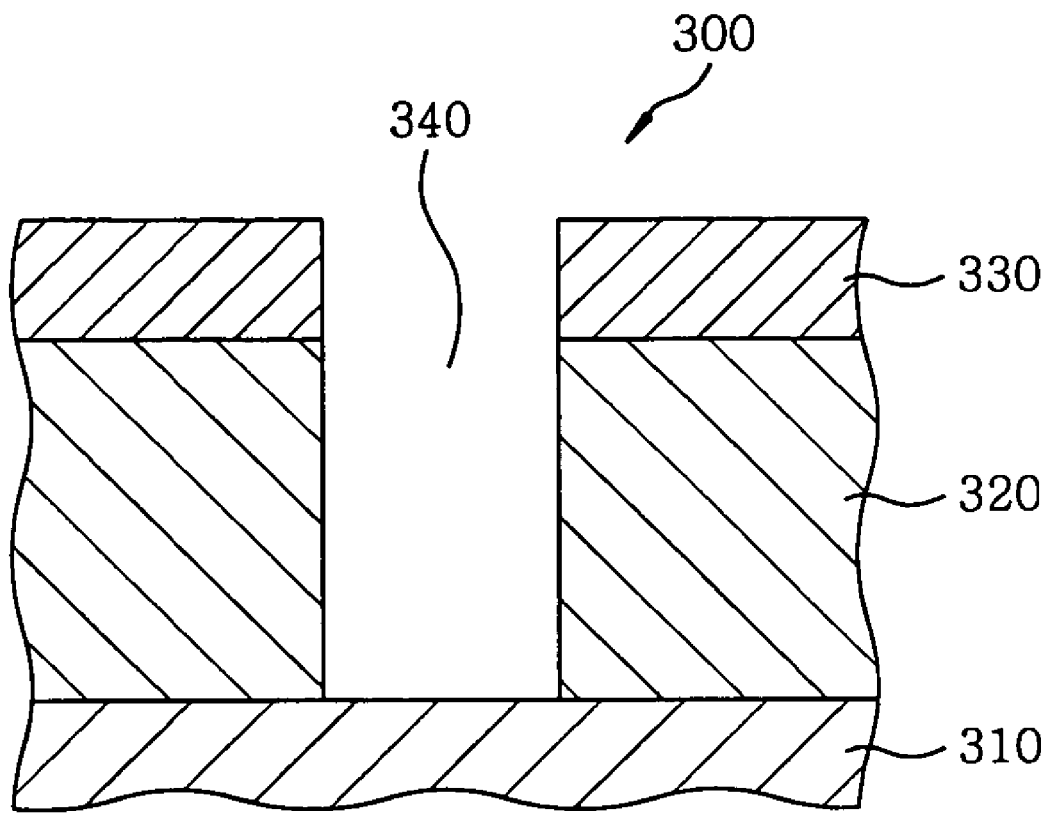

A detailed description will be given of the plasma processing performed based on the above-described principle by using the etching apparatus 100. Here, as an example of the plasma processing, the etching of the silicon oxide film will be described. As shown in FIGS. 4A to 4C, the silicon oxide film 320 was etched by using the resist film 330 as the mask to form a contact hole 340. In detail, the main etching process (first process) was first conducted, and the over-etching process (second process) was subsequently conducted. The main etching process was conducted under the same process condition as the first process condition.

In this example, the main etching process (first process) was ended at the time when the reduction rate of the thickness of the resist film 330 was suddenly increased, as indicated by the dotted line shown in FIG. 3. In detail, after a differential value of the thickness of the resist film 330 was calculated by the operating unit 212 based on a detected value from the light detector 210, a time when the calculated differential value of the thickness coincided with a previously set value was set as the end point of the main etching process. In the above example, the main etching process was ended about 150 seconds after the main etching process started. Because the base silicon film 310 started being exposed at the time when the main etching process was ended, the layer structure 300 had a schematic profile in section as shown in FIG. 4B.

The over-etching process was then conducted under a process condition that the thickness of the resist film 330 was not reduced. In particular, CHxFy was contained in the processing gas. In this example, instead of $CF_4$, $CH_3F$ was added into the processing gas.

A specific second process condition of the over-etching process was as follows. An interior pressure of the processing chamber 102 was 40 mT, the high frequency power applied to the upper electrode 121 was 1800 W, the high frequency power applied to the lower electrode 105 was 1400 W, and $C_4F_6$, $CH_3F$, Ar, and $O_2$ as the processing gas were fed into the processing chamber 102 at respective flow rates of $C_4F_6/CH_3F/Ar/O_2$=25 sccm/5 sccm/900 sccm/26 sccm. Respective temperatures of the upper electrode 121, the lower electrode 105 and the sidewall of the processing chamber 102 were 20° C., 50° C. and 60° C., while a distance between the upper electrode 121 and the wafer W was 45 mm, and pressures of the backside gas supplied to the center and edges of the backside of the wafer W were 15 Torr and 25 Torr, respectively.

The over-etching process was finished after 120 seconds since the start thereof. Because the silicon oxide film 320 was completely etched in the over-etching process, the layer structure 300 at this time had a schematic profile in section as shown in FIG. 4C.

The etching rate of the resist film 330 was 86 nm/min and the thickness of the resist film 330 was 197 nm at the time when the main etching process was ended (about after 150 sec). Additionally, the thickness of the resist film 330 was 197 nm after 120 sec since the start of the over-etching process. In case that the over-etching process had been conducted for 120 sec under the condition in which only the flow rate of $CH_3F$ was increased to 6 sccm, the thickness of the resist film 330 was 257 nm.

The thickness of the resist film 330 was slowly increased after the main etching process was shifted into the over etching process, as indicated by the one-dot chain line as shown in FIG. 3. From FIG. 3, it can be seen that the reduction in thickness of the resist film 330 was suppressed.

As described above, in the present invention, the etching of the layer structure was conducted while the thickness of the resist film 330 being monitored and the main etching process (first process) was changed to the over-etching process (second process) at the time when the reduction rate of the thickness of the resist film 330 was rapidly increased, wherein the over-etching process was conducted under the process condition in which the thickness of the resist film 330 was not reduced, thereby preventing the thickness of the resist film 330 from being reduced during the etching of the layer structure.

(Second Embodiment)

A second embodiment of the present invention will now be described. In the second embodiment, the over-etching process is conducted under another process condition in which the selectivity against the resist film 330 is relatively high. Specifically, the over-etching process is performed under a process condition in which the processing gas compensates for components being reduced when the main etching process is converted into the over etching process.

For example, in case that the silicon oxide film 320 is etched by using the resist film 330 as the mask and by using CxFy, Ar, and $O_2$ as the processing gas like in the first embodiment of the present invention, during the etching of the silicon oxide film 320, the thickness of the resist film 330 is not significantly reduced for a time period, but rapidly reduced thereafter, as indicated by the solid line in FIG. 3.

The reduction of CO is considered as one reason for this as described above. In other words, when the amount of CO is reduced, it is difficult to suppress the effect of $O_2$ in removing the reaction product contained in the processing gas, and thus, the reaction product is easily removed. Furthermore, $O_2$ also acts to etch the resist film 330 to reduce the selectivity against the resist film 330 so that areas of the resist film 330 exposed to $O_2$ without being protected by the protective layer due to the removal of the reaction product are reduced in thickness.

Accordingly, in the second embodiment of the present invention, by compensating reduced COx, such as CO, with the processing gas in the over-etching process, the removal of the reaction product by $O_2$ is suppressed to thereby prevent the reaction product from being removed from the surface of the resist film 330. As a result, the reduction in thickness of the resist film 330 can be prevented.

Although, in this embodiment, there has been described a case in which CO is reduced when the main etching process is changed to the over-etching process, reduced components may be varied depending on the layer structure being etched, the processing gas and the like. As a separate example, the etching of an organic-based low-k layer is considered. In this case, there was provided a layer structure in which a SiN layer was used as the base layer, and a target organic-based low-k layer was formed on the SiN layer. An oxide layer as a hard mask was formed on the organic-based low-k layer, and a photoresist (PR) layer was formed on the oxide layer. When the above layer structure was etched, the organic-based low-k layer and the PR layer were simultaneously etched, and the ashing of the PR layer was simultaneously ended when the etching was ended. In such an etching process, the amount of the reaction product, containing CHx, from the PR layer is reduced when the PR layer is removed before the organic-based low-k layer is removed, thereby resulting in a significant variation in etching characteristics of the organic-based low-k layer. Accordingly, by supplying the reduced CHx as the processing gas in the over-etching process, the variation in etching characteristics of the organic-based low-k layer can be prevented even though the PR layer is removed before the organic-based low-k layer is removed. In this way, the etching of the organic-based low-k layer can be stably conducted.

Hereinafter, a timing of change from the main etching process to the over-etching process in the second embodiment of the present invention will be described. As in the first embodiment of the present invention, the main etching process is changed to the over-etching process at the time when the thickness of the resist film 330 is rapidly reduced in the second embodiment of the present invention. In the first embodiment of the present invention, the interference waves of rays reflected from the wafer are detected to evaluate the thickness of the resist film 330 as shown in FIG. 2, thereby determining the time when the reduction rate of the thickness of the resist film 330 is suddenly increased, as indicated by the dotted line in FIG. 3. In the second embodiment of the present invention, the thickness of the resist film 330 may be directly monitored in accordance with the same procedure as the first embodiment.

Alternatively, the thickness of the resist film 330 may be indirectly evaluated by detecting the components reduced during the etching of the layer structure in the second embodiment of the present invention. For example, in the case of etching the silicon oxide film 320, when the thickness of the resist film 330 is rapidly reduced, the base layer starts being exposed so that the amount of CO is rapidly reduced. Hence, the main etching process may be changed to the over-etching process in such a way that the main etching process is conducted while monitoring the amount of CO, and then shifted to the over-etching process at the time when the amount of CO is rapidly reduced. Specifically, the over-etching process may be conducted under a process condition in which the processing gas compensates for reduced CO when the differential value of the amount of CO is greater than a predetermined value.

As well, the components reduced during the etching of the layer structure may be detected by detecting a plasma emission spectrum. In detail, a window (not shown), made of quartz, to detect the plasma emission therethrough is installed in the processing chamber 102 and the plasma emission spectrum is transferred from the processing chamber 102 through the window to a photoreceptor of an end point detector (not shown) installed outside the processing chamber 102. In the end point detector, an end point of the etching of the layer structure is determined based on the variation of the plasma emission spectrum transferred to the light receiving part.

In accordance with the first and second embodiments of the present invention, the main etching process is conducted while the thickness of the resist film being monitored and then converted into the over-etching process at the time when the thickness of the resist film is rapidly reduced. Then, the over-etching process is conducted under a process condition in which the thickness of the resist film is not reduced. In this way, the reduction in thickness of the resist film can be prevented and the resist film can be prevented from being removed during the etching of the layer structure. Accordingly, a portion of the layer structure, which should not be etched, is shielded from being etched.

In the present invention, the main etching process is shifted to the over etching process on the basis of only the resist film. However, because the base layer starts being exposed when the thickness of the resist film is rapidly reduced, if the over-etching process is conducted under a process condition in which the selectivity against the base layer is maintained relatively high, the base layer may be protected.

In other words, the conventional method wherein the main etching process is changed to the over-etching process with reference to the base layer causes a drawback in that the reduction rate of the thickness of the resist film is suddenly increased. In contrast, since in the present invention, the shift of the main etching process to the over-etching process depends on the thickness of the resist film, the thickness of the resist film is prevented from being reduced and also the base layer can be protected. That is to say, in the present invention, upon the shifting the main etching process to the over-etching process, both of the resist and base layers are protected by monitoring only the resist film without paying attention to the base layer.

As apparent from the above description, the present invention provides a plasma processing method capable of preventing the reduction in thickness of the resist film by performing the etching process while a thickness of the resist film being monitored. In this way, the resist film is prevented from being eliminated during the etching process so that it is possible to prevent a portion which is not to be etched from being etched.

While the invention has been shown and described with respect to the preferred embodiments, it will be understood by those skilled in the art that various changes and modifications may be made without departing from the spirit and scope of the invention as defined in the following claims.

For example, the present invention is not limited to a parallel plate plasma etching apparatus, but may be applied to a helicon wave plasma etching apparatus or an inductively coupled plasma etching apparatus.

What is claimed is:

1. A plasma processing method, comprising the steps of:
supplying a processing gas into an airtight processing chamber, plasmizing the processing gas, and plasma-processing a target layer formed on an object to be processed by using a resist film as a mask,
wherein the plasma-processing is conducted while a process condition is being changed on the basis of a variation of a thickness reduction rate of the resist film,
wherein the plasma-processing step includes:
a first process of plasma-processing the target layer while the thickness of the resist film is being monitored until the thickness reduction rate of the resist film reaches a predetermined value; and
a second process of plasma-processing the target layer under a changed process condition in which selectivity against the resist film is higher than in the first process, and
wherein the second process is conducted by using a processing gas containing a gas species which is identical to a by-product gas species produced during first process to reduce the thickness reduction rate of the resist film, an amount of the by-product gas species being reduced as the first process proceeds.

2. The plasma processing method of claim 1, wherein the thickness of the resist film is observed by detecting interference waves of rays reflected from the resist film in the first process.

3. The plasma processing method of claim 1, wherein the second process is conducted under a process condition by using a processing gas containing one or more components reduced in the chamber during the first process.

4. The plasma processing method of claim 3, wherein the target layer includes an oxide layer containing silicon, the first process is conducted by using a processing gas containing a CF-based gas, and the second process is conducted by using a processing gas containing a COx gas.

* * * * *